United States Patent
Cho et al.

(10) Patent No.: US 7,436,711 B2
(45) Date of Patent: Oct. 14, 2008

(54) SEMICONDUCTOR MEMORY DEVICE

(75) Inventors: Beak-Hyung Cho, Hwaseong-si (KR); Sang-beom Kang, Hwaseong-si (KR); Hyung-rok Oh, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/779,476

(22) Filed: Jul. 18, 2007

(65) Prior Publication Data
US 2008/0016271 A1 Jan. 17, 2008

Related U.S. Application Data

(62) Division of application No. 11/253,626, filed on Oct. 20, 2005, now Pat. No. 7,262,990.

(30) Foreign Application Priority Data
Oct. 26, 2004 (KR) .................. 10-2004-0085800

(51) Int. Cl.
*G11C 11/34* (2006.01)
(52) U.S. Cl. ................. 365/185.23; 365/230.06; 365/163
(58) Field of Classification Search ............ 365/185.23, 365/230.06, 163
See application file for complete search history.

(56) References Cited

U.S. PATENT DOCUMENTS

| 6,487,113 B1 | 11/2002 | Park et al. |
| 6,687,153 B2 | 2/2004 | Lowrey |
| 7,012,834 B2 * | 3/2006 | Cho et al. ............... 365/163 |

FOREIGN PATENT DOCUMENTS

JP 2001-024485 1/2001

* cited by examiner

*Primary Examiner*—Huan Hoang
*Assistant Examiner*—Jason Lappas
(74) *Attorney, Agent, or Firm*—Volentine & Whitt, PLLC.

(57) ABSTRACT

A semiconductor memory device includes: phase-change memory cells whose states change to a set resistance state or a reset resistance state in response to an applied current pulse; a set pulse driving circuit outputting a set current pulse having first through n-th stages in response to a first control signal and a set control signal wherein current amounts of the first through n-th stages are sequentially reduced and are all greater than a reference current amount; a reset pulse driving circuit outputting a reset current pulse in response to a second control signal; a pull-down device activating the set pulse driving circuit and the reset pulse driving circuit in response to a third control signal; and a write driver control circuit outputting the first through third control signals in response to write data, a set pulse width control signal, and a reset pulse width control signal.

10 Claims, 9 Drawing Sheets

| OP1 | OP2 | SLOW QUENCH TYPE |
|------|------|------------------|
| HIGH | HIGH | FIG. 1B |
| HIGH | LOW | FIG. 1C |
| LOW | HIGH | FIG. 1D |

SEMICONDUCTOR MEMORY DEVICE

CROSS REFERENCES TO RELATED APPLICATIONS

This is a divisional of U.S. patent application Ser. No. 11/253,626, filed 20 Oct. 2005, the contents of which are incorporated herein by reference in their entirety, and also claims the priority benefit under 35 U.S.C. § 119 from Korean Patent Application No. 2004-0085800, filed on 26 Oct. 2004, the contents of which are hereby incorporated by reference in their entirety for all purposes as if fully set forth herein.

BACKGROUND AND SUMMARY OF THE INVENTION

This application claims the priority of Korean Patent Application No. 2004-0085800, filed on Oct. 26, 2004, in the Korean Intellectual Property Office, the disclosure of which is incorporated herein in its entirety by reference.

1. Field of the Invention

The present invention relates to a semiconductor memory device, and more particularly, to a programming method for setting a phase-change memory array and a semiconductor memory device implementing the programming method.

2. Description of the Related Art

PRAMs (Phase-change Random Access Memories) are non-volatile memory devices for storing data using a material (hereinafter, referred to as phase-change material), such as GST (Ge—Sb—Te), whose resistance changes according to a change of phase of the material. PRAMs, which are non-volatile, can achieve low power consumption as well as having all the advantages of DRAMs. When data is written to a PRAM, a current flows in a phase-change material and the phase-change material changes to a crystalline state or to an amorphous state, depending upon the amplitude and duration of the current That is, whether the phase-change material changes to a crystalline state or an amorphous state depends on the amplitude and duration of current flowing through the phase-change material. amorphous state, which is generally called a reset state corresponding to data value of "1".

If a current having an amplitude smaller than the reset current flows through the phase-change material for a long time period, the phase-change material changes to the crystalline state, which is generally called a set state corresponding to data of "0".

The resistance of the phase-change material is greater in the reset state than in the set state. An initial set state of a memory cell is changed to a reset state by passing a reset current through the phase-change material to heat the phase-change material above a melting temperature and then quickly cooling the phase-change material.

On the other hand an initial reset state of a memory cell is changed to a set state by passing a set current through the phase-change material to heat the phase-change material above a crystallization temperature, maintaining the phase-change material at the temperature for a predetermined time, and then cooling the phase-change material.

FIG. 1A shows exemplary current pulses for writing data in a phase-change material.

Referring to FIG. 1A, by applying a short, large current pulse I_RESET to the phase-change material, melting the phase-change material, and then quickly cooling the phase-change material, the phase-change material is changed to an amorphous state (reset state). Conversely, by applying a long, small current pulse I_SET to the phase-change material and heating the phase-change material above a crystallization temperature, the phase-change material is changed to a crystalline state (set state).

However, in a memory array including a plurality of phase-change memory cells, the parasitic resistances of the memory cells can be different from each other according to the arrangement of the memory cells in the memory array.

Also, the loads on signal lines connected respectively to the memory cells can be different from each other and the respective memory cells can have different reset currents due to variations in of the memory array area. The difference in the reset currents of the memory cells causes a difference in set currents. As such, since, in a memory cell array including a plurality of phase-change cells, set currents for changing the respective phase-change cells to a set state are different from each other, it is impossible to change all memory cells to a set state using a constant set current.

That is, while some memory cells change to a set state, the other memory cells may remain in a reset state. Or, some memory cells that are in the set state can have different resistances from those of the remaining memory cells that are in the set state. This can cause operating errors of the phase-change memory array.

FIGS. 1B through 1D show waveforms of various set current pulses that may be used to address the problems in set programming as described above with reference to FIG. 1A.

Accordingly, it would be desirable to provide a more effective circuit for generating the set current pulses shown in FIGS. 1B-1D. It would also be desirable to provide a phase-change semiconductor memory device capable of changing all memory cells of a phase-change memory array to a set state.

According to an aspect of the present invention, there is provided a semiconductor memory device including phase-change cells whose states transit to a reset resistance state or a set resistance state in response to an applied current pulse, comprising: a set pulse driving circuit outputting a set current pulse having first through n-th stages in response to a first control signal and a set control signal, wherein a minimum current amount of the first through n-th stages is larger than a reference current amount and current amounts of the first through n-th stages are sequentially reduced; a reset pulse driving circuit outputting a reset current pulse in response to a second control signal; a pull-down device activating the set pulse driving circuit and the reset pulse driving circuit in response to a third control signal; and a write driver control circuit outputting the first through third control signals in response to write data, a set pulse width control signal, and a reset pulse width control signal. The set control signal is a voltage pulse having first through n-th stages whose minimum voltage is larger than a reference voltage and whose voltages are sequentially reduced.

The semiconductor memory device further comprises: an oscillator activated in response to an operation activation signal, outputting clock pulses in response to a pull-up control signal and a pull-down control signal; a shifter receiving the clock pulses and the operation activation signal and outputting the first through n-th control pulses in response to a shift control signal; and a set control circuit outputting the set control signal in response to the operation activation signal and the first through n-th control pulses.

In the oscillator, if a voltage level of the pull-up control signal rises or if a voltage level of the pull-down control signal falls down, a period of each clock pulse becomes longer.

The set control circuit comprises: a control node; a controller receiving the operation activation signal and controlling such that a voltage of the control node is sequentially reduced in response to the first through n-th control pulses; and a set control signal generator controlling a waveform of the set control signal output from the control node according to logic levels of mode control signals.

According to another aspect of the present invention, there is provided a semiconductor memory device comprising: a set control circuit generating a set control signal in response to first through n-th control pulses each sequentially activated for each predetermined time such that activation times of the first through n-th pulses do not overlap to each other; a write driver generating a set current pulse in response to the set control signal while a set pulse width control signal is activated if write data is set data, and generating a reset current pulse while a reset pulse width control signal is activated if the write data is reset data, wherein the set current pulse has first through n-th stages whose minimum current amount is larger than a reference current amount and whose current amounts are sequentially reduced; and a pulse generation circuit generating the set pulse width control signal and the reset pulse width control signal in response to a write enable pulse indicating data writing and the first through n-th control pulses.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, embodiments of the present invention will be described in detail with reference to the appended drawings. Like reference numbers refer to like components throughout the drawings.

Figure 2:
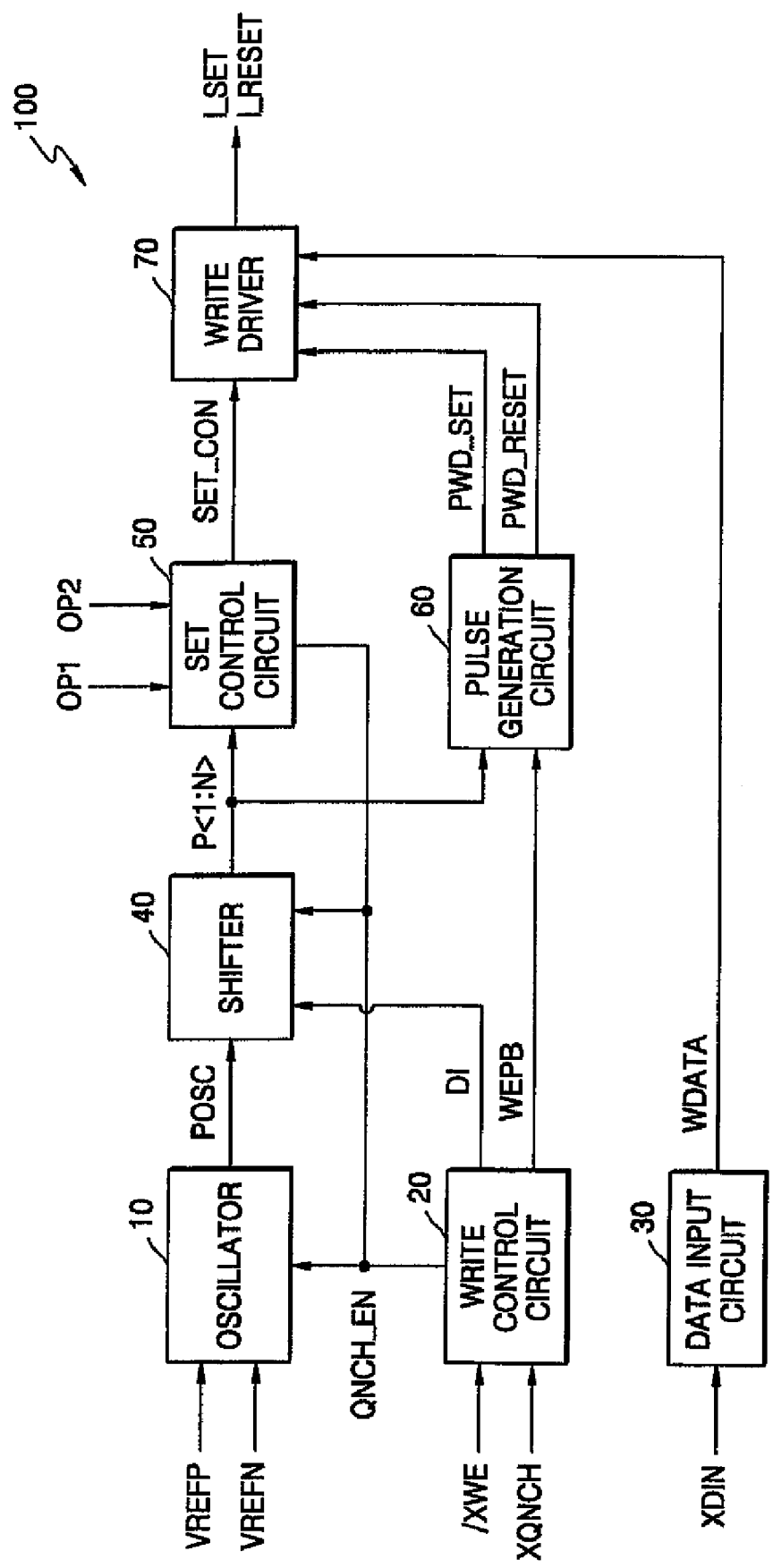
FIG. 2 is a block diagram of a semiconductor memory device according to one or more aspects of the present invention.

FIG. 2 is a block diagram of a semiconductor memory device 100.

Referring to FIG. 2, the semiconductor memory device 100 includes an oscillator 10, a write control circuit 20, a data input circuit 30, a shifter 40, a set control circuit 50, a pulse generation circuit 60, and a write driver 70.

The oscillator 10 is activated in response to an operation activation signal QNCH_EN and outputs a clock pulse POSC in response to a pull-up control signal and a pull-down control signal. The write control circuit 20 outputs the operation activation signal QNCH_EN, a shift control signal DI, and a write enable pulse WEPB for activating the pulse generation circuit 60, in response to a write enable pulse/XWE and an operation signal XQNCH with a constant level.

The data input circuit 30 receives external data XDIN and outputs write data WDATA. The shifter 40 receives the clock pulse POSC and the operation activation signal QNCH_EN and outputs first through n-th control pulses P1 through Pn in response to the shift control signal DI.

The set control circuit 50 outputs a set control signal SET_CON in response to the first through n-th control pulses P1 through Pn and the operation activation signal QNCH_EN.

The pulse generation circuit 60 outputs a set pulse-width control signal PWD_SET and a reset pulse-width control signal PWD_RESET in response to the first through n-th control pulses P1 through Pn and the write enable pulse WEPB.

The write driver 70 outputs a set current pulse I_SET and a reset current pulse I_RESET in response to the set pulse-width control signal PWD_SET, the reset pulse-width control signal PWD_RESET, and the set control signal SET_CON.

Figure 3A:
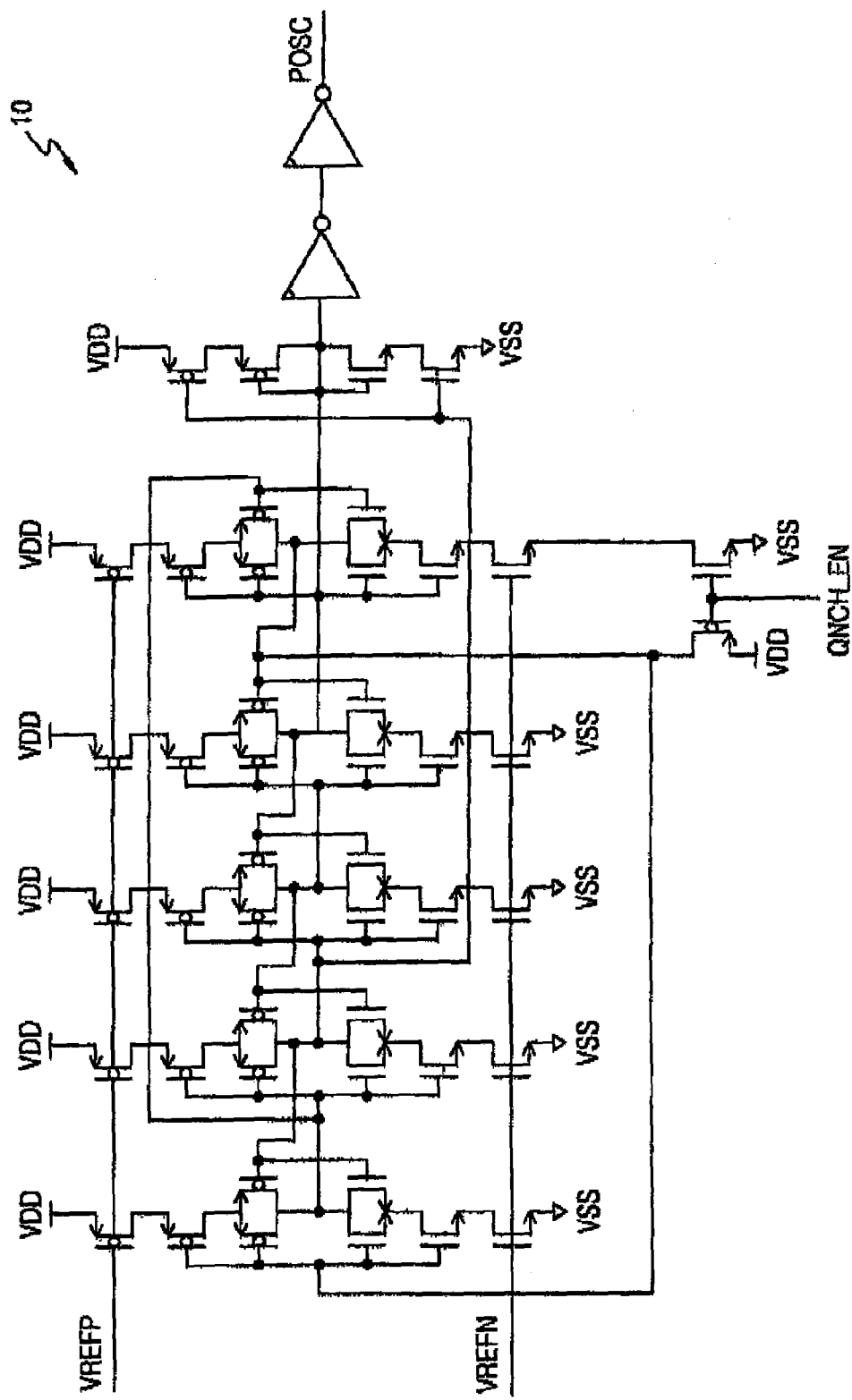
FIG. 3A is a circuit diagram of an oscillator of FIG. 2.

FIG. 3A is a circuit diagram of the oscillator 10 of FIG. 2.

Figure 3B:
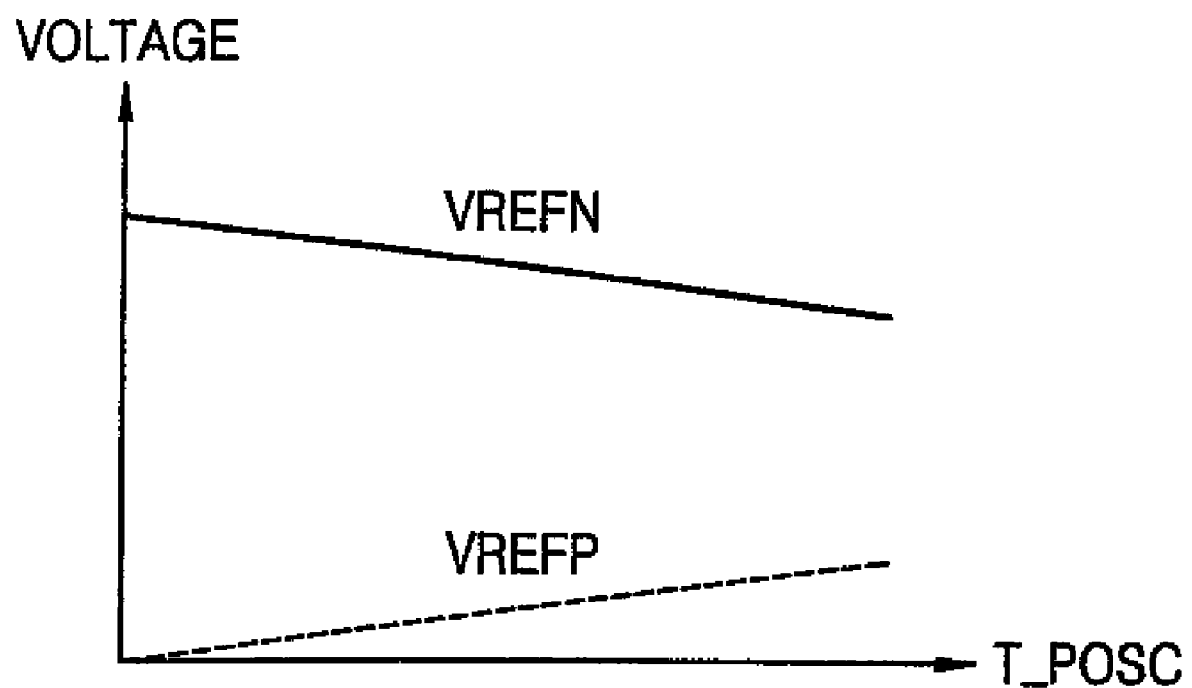
FIG. 3B is a view for explaining clock pulses according to pull-up and pull-down control signals used in the oscillator of FIG. 3A.

FIG. 3B is a view for explaining clock pulses according to a pull-up control signal VREFP and a pull-down control signal VREFN used in the oscillator 10 of FIG. 3A.

Referring to FIGS. 3A and 3B, the oscillator 10 includes PMOS transistors and NMOS transistors connected in serial between a supply voltage VDD and a ground voltage VSS. The oscillator 10 outputs the clock pulse POSC while the operation activation signal QNCH_EN is activated, in response to the write enable signal WEPB (see FIGS. 6 and 7).

Also, if the voltage level of the pull-up control signal VREFP rises, a turn-on resistance of a PMOS transistor of the oscillator 10, whose gate terminal receives the pull-up control signal VREFP, increases, which increases a time constant and increases the period of the clock pulse POSC.

If the voltage level of the pull-down control signal VREFN drops, a turn-on resistance of a NMOS transistor of the oscillator 10, through gate terminal receives the pull-down control signal VREFN, increases, which increases a time constant and increases the period of the clock pulse POSC.

Figure 4A:
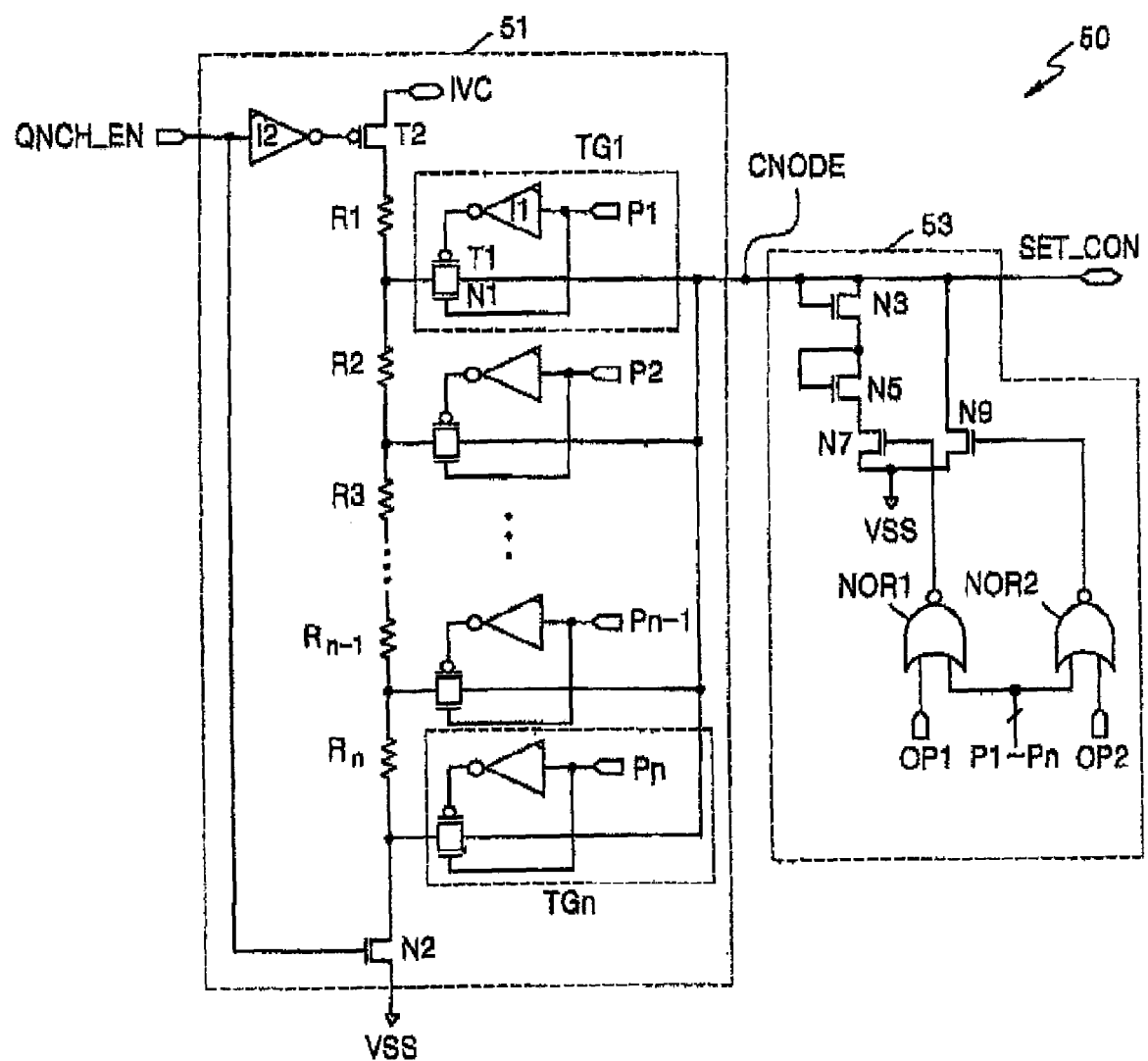
FIG. 4A is a circuit diagram of a set control circuit of FIG. 2.

FIG. 4A is a circuit diagram of the set control circuit 50 of FIG. 2.

Figures 4B, 5:
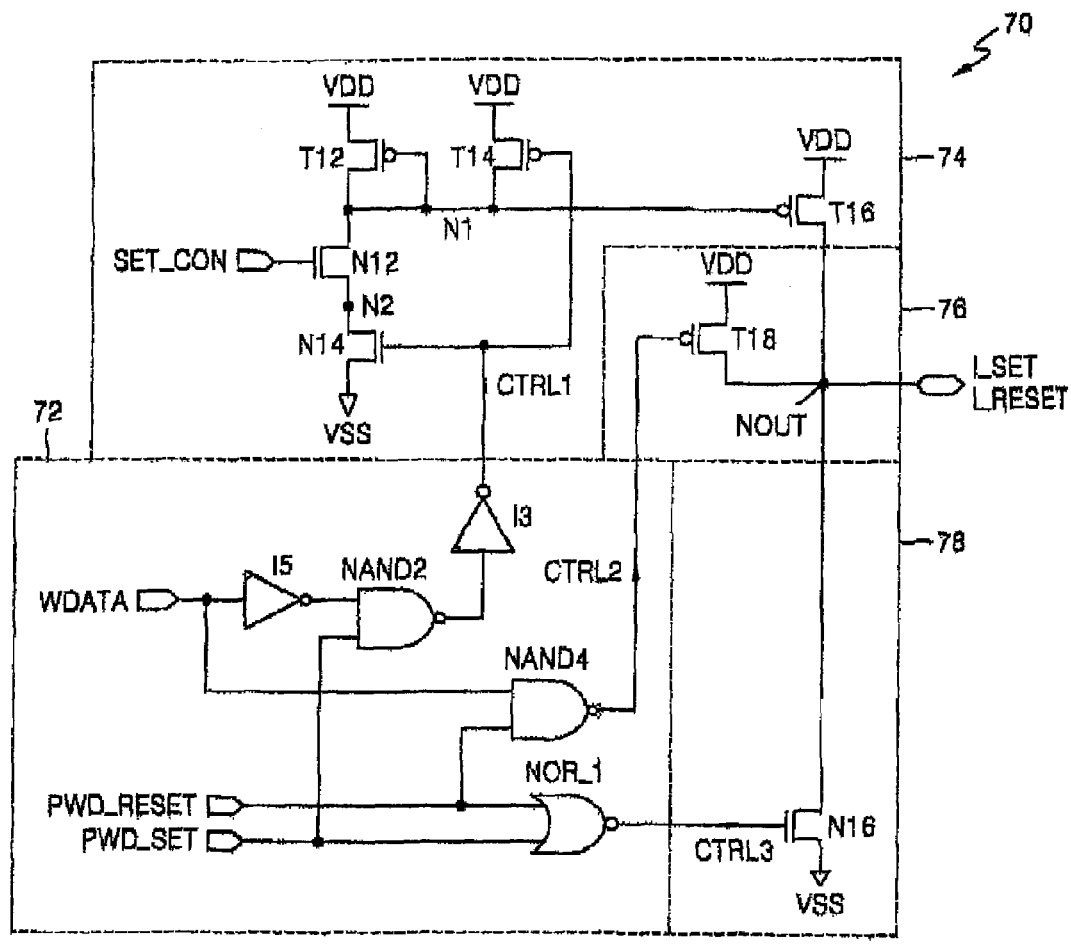
FIG. 4B is a table for setting the waveforms of output signals of the set control circuit of FIG. 4A.
FIG. 5 is a circuit diagram of a write driver of FIG. 2.

FIG. 4B is a table for setting the waveforms of set control signals according to option signals (or, mode control signals) of FIG. 4A.

Referring to FIG. 4A, the set control circuit 50 includes a control node CNODE, a controller 51, and a set control signal generator 53.

The controller 51 receives an operation activation signal QNCH_EN and controls the voltage level of the control node CNODE so that the voltage level of the control node CNODE is sequentially lowered in response to the first through n-th control pulses P1 through Pn. The set control signal generator 53 controls the waveform of a set control signal SET_CON output from the control node CNODE according to the logic levels of mode control signals OP1 and OP2.

The controller 51 includes an inverter I2, a PMOS transistor T2, an NMOS transistor N2, a plurality of serially-connected resistors R1 through Rn, wherein the PMOS and NMOS transistors T2 and N2 and the plurality of resistors R1 through Rn are serially connected between an external voltage IVC and a ground voltage VSS, and a plurality of transmission gates TG1 through TGn for controlling a voltage of the control node CNODE in response to the first through n-th control pulses P1 through Pn.

The set control signal generator 53 includes first and second NOR gates NOR1 and NOR2, a first waveform control transistor N9, a plurality of diodes N3 and N5, and a second waveform control transistor N7.

The first and second NOR gates NOR1 and NOR2 perform NOR operations with the respective mode control signals OP1 and OP2 and the respective first though n-th control pulses P1 through Pn. The first waveform control transistor N9 connects/disconnects the control node CNODE to/from the ground voltage VSS in response to an output of the second NOR gate NOR2.

The plurality of diodes N3 and N5 are connected in serial to the control node CNODE. The second waveform control transistor N7 connects/disconnects the diodes N3 and N5 to/from the ground voltage VSS in response to an output of the first NOR gate NOR1.

Figure 1A:
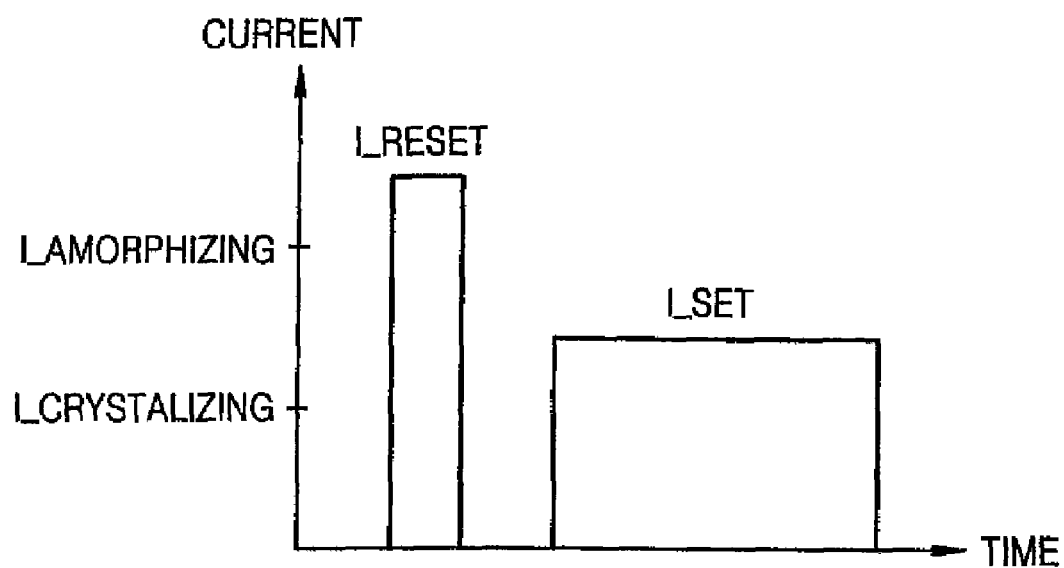
FIG. 1A shows exemplary current pulses for writing data in a phase change material.
Figure 1B:
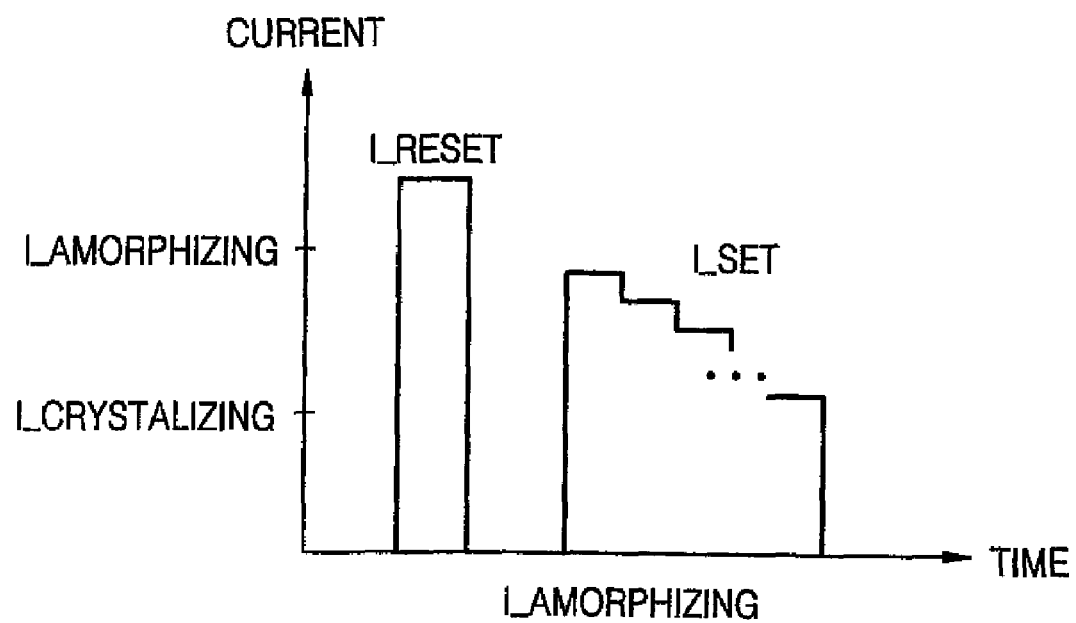
FIG. 1B shows an example of set current pulses applied to a phase-change memory array according to one or more aspects of the present invention.
Figure 1C:
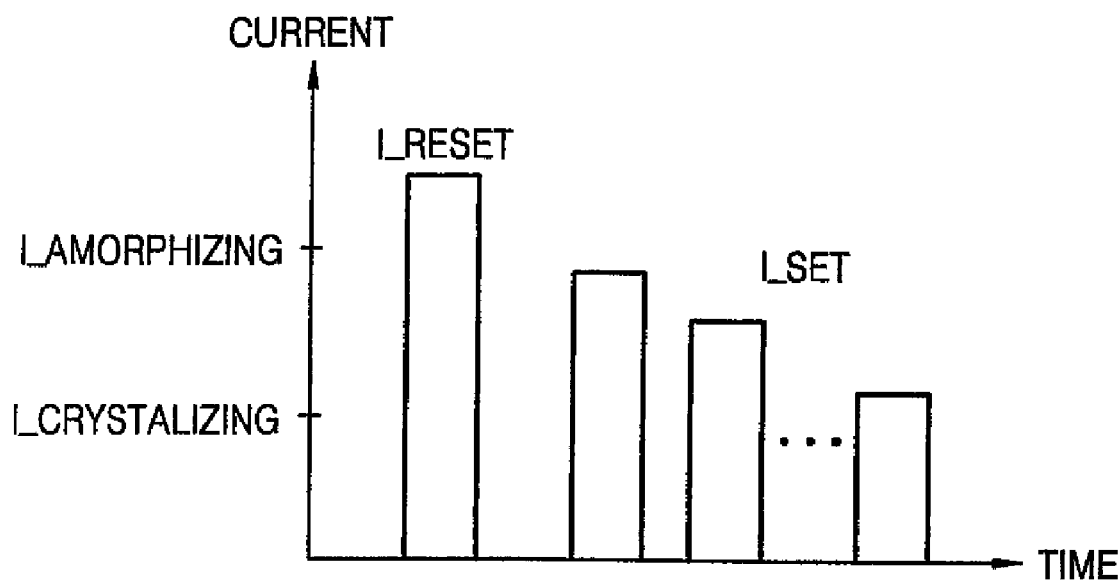
FIG. 1C shows another example of set current pulses applied to a phase-change memory.
Figure 1D:
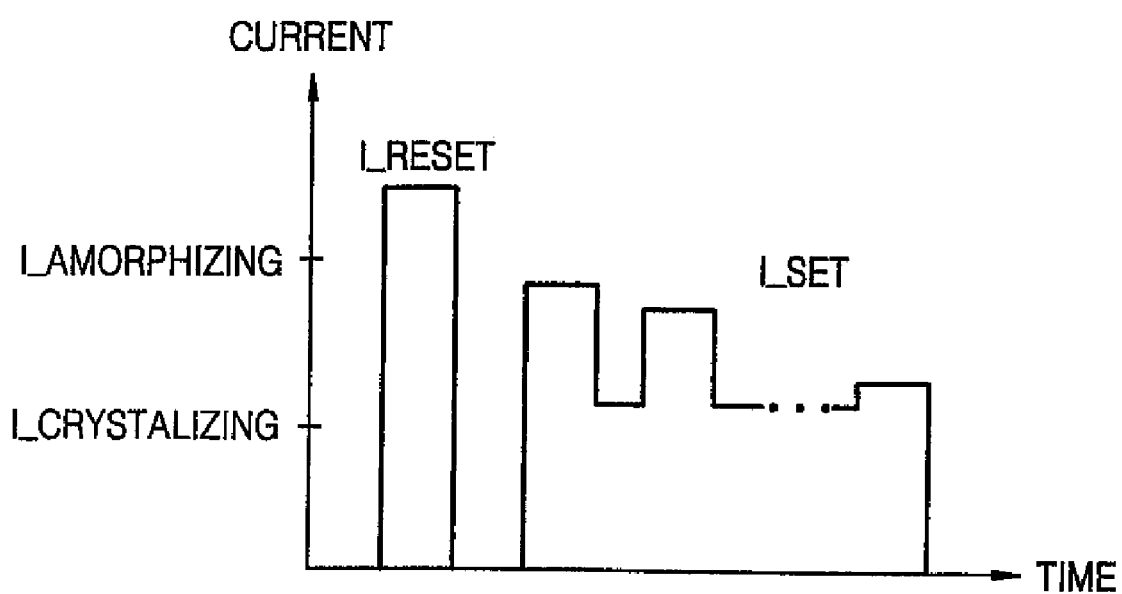
FIG. 1D shows still another example of set current pulses applied to a phase-change memory array.

Referring to FIG. 4B, the set control circuit 50 can output set control signals SET_CON with the same waveforms as the set current pulses shown in FIGS. 1B, 1C, and 1D, according to the voltage level of the mode control signals OP1 through OP2. The mode control signals OP1 through OP2 can be directly received from an external source or can be output from an option circuit with fuses, etc. The logic levels of the mode control signals OP1 and OP2 can be set by a circuit designer.

It is assumed that the mode control signal OP1 is in a low level and the mode control signal OP2 is in a high level. Then, the second NOR gate NOR2 always outputs a low level signal regardless of the signal levels of the first through n-th control pulses P1 through Pn and the transistor N9 is turned off.

The first NOR gate NOR1 outputs a high level signal while the first through n-th control pulses P1 through Pn are in a low level, thus turning on the transistor N7. Thus, the voltage level of the set control signal SET_CON is reduced to a constant voltage by transistors N3 and N5 forming a diode while the first through n-th control pulses are in the low level, so that the waveform of the set control signal SET_CON becomes equal to that of the set current pulse I_SET of FIG. 1D.

It is preferable to construct a diode using two transistors N3 and N5, however, it is also possible to change the number of used transistors. FIG. 5 is a circuit diagram of the write driver 70 of FIG. 2.

Referring to FIG. 5, the write driver 70 includes a write driver control circuit 72, a set pulse driving circuit 74, a reset pulse driving circuit 76, and a pull-down device 78. The write driver control circuit 72 includes a plurality of inverters I3 and I4, a plurality of NAND gates NAND2 and NAND4, and a NOR gate NOR_1.

The set pulse driving circuit 74 includes first through fifth transistors T12, T14, T16, N12, and T18. The first terminal of the first transistor T12 is connected to a supply voltage VDD and the gate and second terminal of the first transistor T12 are connected to a first node N1. The first terminal of the second transistor T14 is connected to the supply voltage VDD, the gate of the second transistor T14 is connected to a first control signal CTRL1, and the second terminal of the second transistor T14 is connected to the first node N1.

The first terminal of the third transistor T16 is connected to the supply voltage VDD, the gate of the third transistor T16 is connected to the first node N1, and the second terminal of the third transistor T16 is connected to an output node NOUT. The first terminal of the fourth transistor N12 is connected to the first node N1, the gate of the fourth transistor N12 is connected to a set control signal SET_CON, and the second terminal of the fourth transistor N12 is connected to a second node N2.

The first terminal of the fifth transistor N14 is connected to the second node N2, the gate of the fifth transistor N14 is connected to a first control signal CTRL1, and the second terminal of the fifth transistor N14 is connected to a ground voltage VSS. The reset pulse driving circuit 76 includes a sixth transistor T18, whose first terminal is connected to the supply voltage VDD, whose gate is connected to a second control signal CTRL2, and whose second terminal is connected to the output node NOUT. The current driving capability of the sixth transistor T18 is greater than that of the third transistor T16. The pull-down device 78 includes a NMOS transistor N16.

Figure 6:
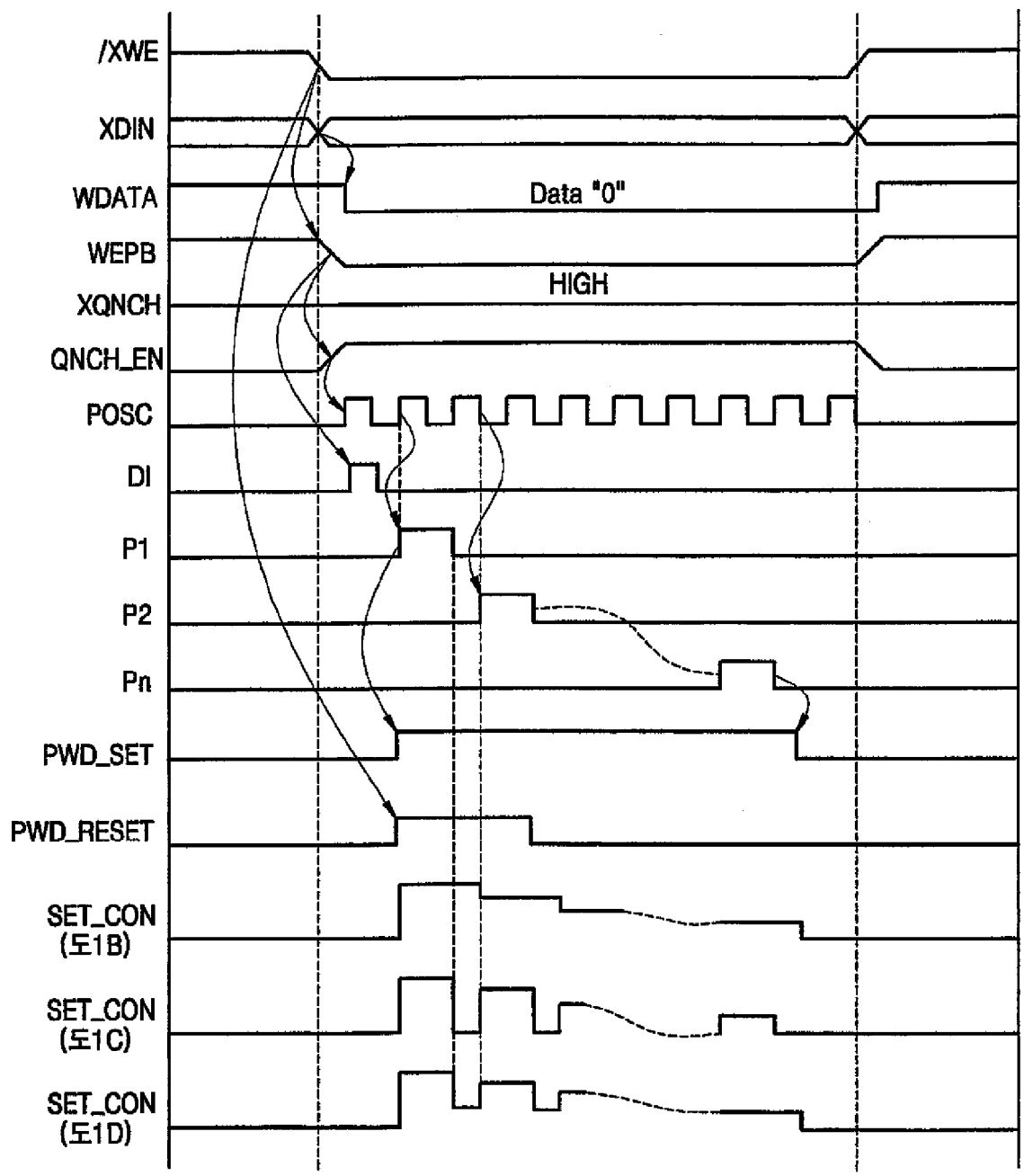
FIG. 6 is a timing diagram for explaining a set programming operation performed by the semiconductor memory device of FIG. 2.

FIG. 6 is a timing diagram for explaining the set programming operation of the semiconductor memory device 100 of FIG. 2.

Hereinafter, the set programming operation of the semiconductor memory device 100 will be described in detail with reference to FIGS. 2 through 6.

Referring to FIG. 6, first, external data XDIN is output as write data WDATA in a low level through a data input circuit 30.

Then, an operation activation signal QNCH_EN transits to a high level when a write enable pulse WEPB is changed to a low level. Referring to FIG. 3A, if the operation activation signal QNCH_EN transits to a high level, the oscillator 10 is activated, thus outputting a clock pulse POSC. It the operation activation signal QNCH_EN transits to a low level, the oscillator 10 is deactivated, thus stopping outputting the clock pulse POSC.

Referring to FIGS. 2 and 6, the shifter 40 outputs first through n-th control signals P1 through Pn, in response to the clock pulse POSC, a shift control signal DI, and the operation activation signal QNCH_EN.

The shifter 40 can be implemented by a plurality of D flip-flops (not shown). The pulse generation circuit 60 receives the first through n-th control pulses P1 through Pn and the write enable pulse WEPB and outputs a set pulse width control signal PWD_SET and a reset pulse width control signal PWD_RESET.

The set pulse width control signal PWD_SET is activated when the first control pulse P1 is activated and deactivated when the n-th control pulse Pn is deactivated. The reset pulse width control signal PWD_RESET is deactivated after being activated for a predetermined time when a write enable signal/XWE is activated.

Referring to FIGS. 4A and 4B, when the operation activation signal QNCH_EN transits to a high level, the set control circuit 50 can output set control signals SET_CON with different waveforms according to the logic levels of the mode control signals OP1 through OP2, as shown in FIG. 6.

Referring to FIG. 5, since the write data WDATA is in the low level and the set pulse width control signal PWD_SET is in the high level during set programming, a NAND gate NAND4 outputs a second control signal CTRL2 of a high level, so that the sixth transistor T18 is turned off.

The NOR gate NOR_1 outputs a third control signal CTRL 3 of a low level and accordingly the transistor N16 is turned off. A NAND gate NAND2 outputs a low level signal and the inverter I3 outputs a first control signal CTRL1 of a high level, so that the second transistor T14 is turned off and the fifth transistor N14 is turned on.

Hereinafter, an example in which the set control signal SET_CON has the waveform of FIG. 1C is described. If the first control signal CTRL1 is in a high level, the second transistor T14 is turned off and the fifth transistor N14 is turned on. At this time, the voltage of the first node N1 is lowered if the set control signal SET_CON of a high level is input. Then, the third transistor T16 is turned on "hard" which increases the current amount of a set current pulse I_SET.

If the set control signal SET_CON of a low level is input, the fourth transistor N12 is turned off and the voltage of the first node N1 increases. Then, the third transistor T16 is slightly turned on, which decreases the current amount of the set current pulse I_SET.

As such, if the set control signal SET_CON is input to the gate of the fourth transistor N12, a set current pulse I_SET with the same waveform as the set control signal SET_CON is output to a corresponding memory cell through the third transistor T16.

Figure 7:
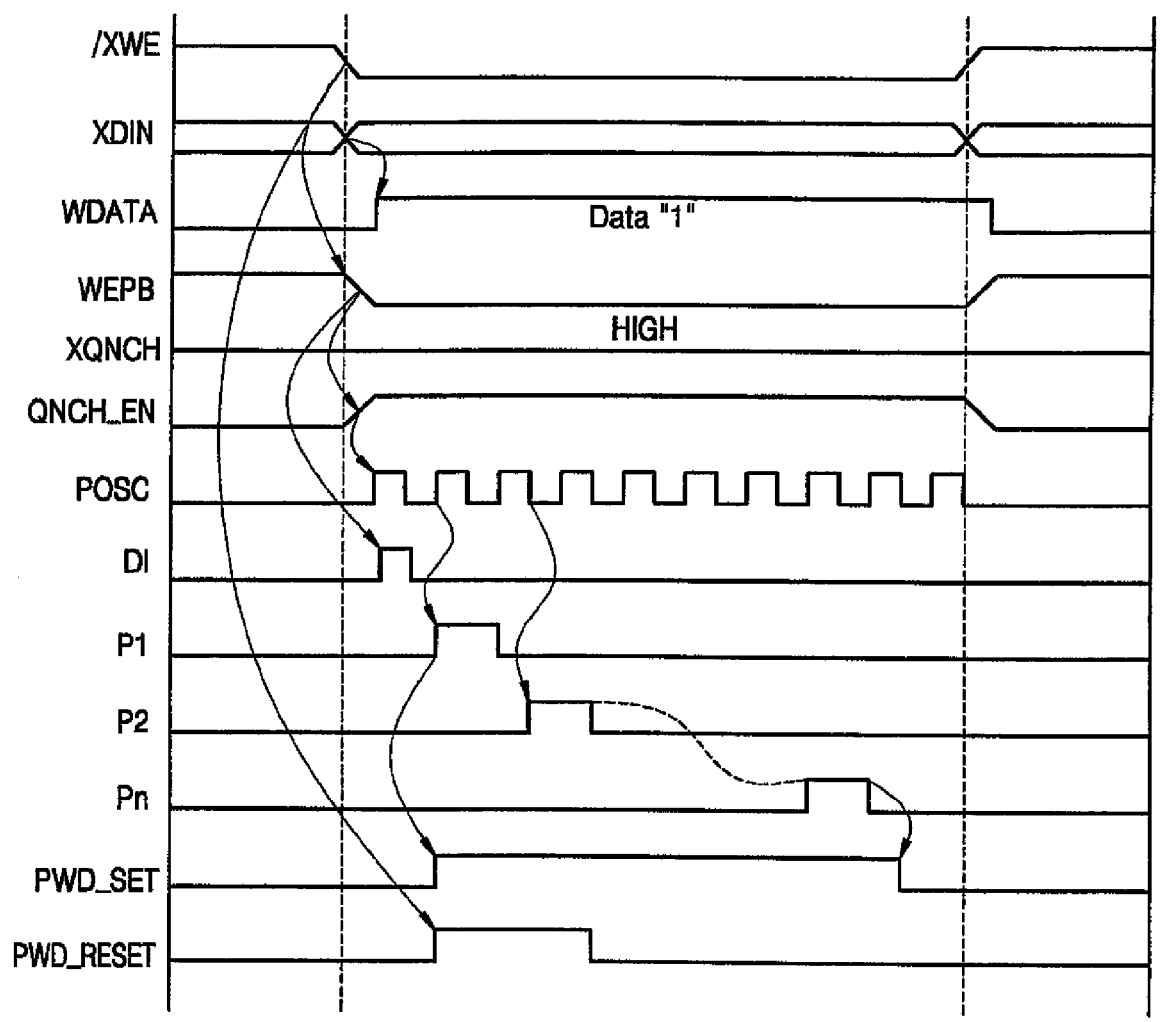
FIG. 7 is a timing diagram for explaining a reset programming operation of the semiconductor memory device of FIG. 2.

FIG. 7 is a timing diagram for explaining a reset programming operation of the semiconductor memory device 100 of FIG. 2.

Hereinafter, the reset programming operation of the semiconductor memory device 100 will be described in detail with reference to FIGS. 5 and 7.

Referring to FIG. 5, since write data WDATA is in a high level during reset programming, the inverter I3 outputs a first control signal CTRL1 of a low level, so that the second transistor T14 is turned on and accordingly the first node N1 becomes high, thus turning off the third transistor T16.

If the reset pulse width control signal PWD_RESET changes to a high level, the NOR gate NOR_1 outputs a third control signal CTRL3 of a low level, so that the transistor N16 is turned off. The NAND gate NAND4 outputs a second control signal CTRL2 of a low level to turn on the sixth transistor T18 and a reset current pulse I_RESET is output to a corresponding memory cell through the sixth transistor T18.

A semiconductor memory device according to another embodiment includes a set control circuit, a write driver, and a pulse generation circuit. The set control circuit generates a set control signal, in response to first through n-th control pulses each sequentially activated for each predetermined time such that the activation times of the first through n-th control pulses do not overlap to each other.

If write data is set data, the write driver generates a set current pulse having first through n-th stages in response to the set control signal while a set pulse width control signal is activated, wherein a minimum current amount of the first through n-th stages is larger than a reference current amount and the current amounts of the first through n-th stages are sequentially reduced. If the write data is reset data, the write driver generates a reset current pulse while a reset pulse width control signal is activated. The pulse generation circuit generates the set pulse width control signal and the reset pulse width control signal, in response to a write enable pulse indicating data writing and the first through n-th control pulses.

The set control circuit included in the semiconductor memory device has the same configuration as the set control circuit 50 of FIG. 2 and operates in the same manner as the set control circuit 50 of FIG. 2. The write driver included in the semiconductor memory device has the same configuration as the write driver 70 of FIG. 2 and operates in the same manner as the write driver 70 of FIG. 2.

The pulse generation circuit included in the semiconductor memory device has the same configuration as the pulse generation circuit 60 of FIG. 2 and operates in the same manner as the pulse generation circuit 60 of FIG. 2. The configurations and functions of the set control circuit 50, the write driver 70, and the pulse generation circuit 60 are described above, and therefore detailed descriptions are omitted.

According to the semiconductor memory device described above, since a write driver circuit is provided to supply a plurality of set current pulses whose current amounts are sequentially reduced, it is possible to make all phase-change memory cells to be in a set state.

Beneficially, the semiconductor memory device described above can be mounted with a logic chip in a System LSI Logic Chip.

While the present invention has been particularly shown and described with reference to exemplary embodiments thereof, it will be understood by those of ordinary skill in the art that various changes in form and details may be made therein without departing from the scope of the present invention as defined by the following claims.

What is claimed is:

1. A semiconductor memory device comprising:
   a set control circuit generating a set control signal in response to first through n-th control pulses each sequentially activated for a set time period such that activation times of the first through n-th control pulses do not overlap each other;
   a write driver generating a set current pulse in response to the set control signal while a set pulse width control signal is activated if write data is set data, and generating a reset current pulse while a reset pulse width control signal is activated if the write data is reset data, wherein the set current pulse has first through n-th stages each of whose minimum current amount is larger than a reference current amount and whose current amounts are sequentially reduced; and
   a pulse generation circuit generating the set pulse width control signal and the reset pulse width control signal in response to a write enable pulse indicating a data writing operation and the first through n-th control pulses.

2. The semiconductor memory device of claim 1, wherein the set control signal is a voltage pulse having first through n-th stages each of whose minimum voltage is larger than a reference voltage and whose voltages are sequentially reduced, wherein a waveform of the voltage pulse is selected according to mode control signals.

3. The semiconductor memory device of claim 2, wherein the set control circuit comprises:
   a control node;
   a controller receiving an operation activation signal and controlling a voltage of the control node so that it is sequentially reduced; and
   a set control signal generator controlling a waveform of a set control signal output from the control node according to logic levels of the mode control signals.

4. The semiconductor memory device of claim 3, wherein the set control signal generator comprises:
   first and second NOR devices each performing a NOR operation on a corresponding one of the mode control signals and each of the first through n-th control pulses;
   a first waveform control transistor connecting/disconnecting the control node to/from a ground voltage in response to an output of the second NOR device;
   a plurality of diodes connected in serial to the control node; and
   a second waveform control transistor connecting/disconnecting the plurality of diodes to/from the ground voltage in response to an output of the first NOR device.

5. The semiconductor memory device of claim 1, wherein the write driver comprises:

a set pulse driving circuit outputting the set current pulse in response to a first control signal and the set control signal;

a reset pulse driving circuit outputting a reset current pulse in response to the second control signal;

a pull-down device activating the set pulse driving circuit and the reset pulse driving circuit in response to a third control signal; and a write driver control circuit outputting the first through third control signals in response to the write data, the set pulse width control signal, and the reset pulse width control signal.

6. The semiconductor memory device of claim 5, wherein the set pulse driving circuit comprises:

a first transistor having a first terminal, a gate, and a second terminal, the first terminal connected to a supply voltage, the gate and the second terminal connected to a first node;

a second transistor having a first terminal, a gate, and a second terminal, the first terminal connected to the supply voltage, the gate connected to the first control signal, and the second terminal connected to the first node;

a third transistor having a first terminal, a gate, and a second terminal, the first terminal connected to the supply voltage, the gate connected to the first node, and the second terminal connected to an output node;

a fourth transistor having a first terminal, a gate, and a second terminal, the first terminal connected to the first node, the gate connected to the set control signal, and the second terminal connected to the second node; and a fifth transistor having a first terminal, a gate, and a second terminal, the first terminal connected to the second node, the gate connected to the first control signal, and the second terminal connected to a ground voltage.

7. The semiconductor memory device of claim 6, wherein the reset pulse driving circuit comprises a sixth transistor having a first terminal, a gate, and a second terminal, the first terminal connected to the supply voltage, the gate connected to the second control signal, and the second terminal connected to the output node, wherein a current driving capability of the sixth transistor is greater than that of the third transistor of the set pulse driving circuit.

8. The semiconductor memory device of claim 1, further comprising:

an oscillator activated in response to an operation activation signal, outputting clock pulses in response to a pull-up control signal and a pull-down control signal; and a shifter receiving the clock pulses and the operation activation signal and outputting the first through n-th control pulses in response to a shift control signal.

9. The semiconductor memory device of claim 8, wherein, in the oscillator, a period of each clock pulse becomes longer in response to at least one of: (a) a voltage level of the pull-up control signal increasing; and (b) a voltage level of the pull-down control signal decreasing.

10. The semiconductor memory device of claim 1, wherein the reference current amount is a current amount for maintaining the phase-change cells at a crystallizing temperature at which the phase-change cells are crystallized.

* * * * *